United States Patent
Khawshe

(10) Patent No.: US 6,762,636 B1
(45) Date of Patent: Jul. 13, 2004

(54) CIRCUIT AND METHOD FOR ADJUSTING DUTY CYCLE OF A HIGH SPEED, LOW SWING OUTPUT SIGNAL

(75) Inventor: Vijay Khawshe, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/014,680

(22) Filed: Dec. 11, 2001

(51) Int. Cl.[7] ............................................. H03K 3/017
(52) U.S. Cl. ........................ 327/175; 327/35; 327/37; 327/178; 327/180
(58) Field of Search ................................ 327/170, 172, 327/173, 174, 175, 178, 180, 31, 35, 37, 540, 541, 543, 108, 112, 345, 263, 264; 326/85, 87

(56) References Cited

U.S. PATENT DOCUMENTS

| | | | |
|---|---|---|---|
| 5,105,102 A | * 4/1992 | Shioda | 327/112 |
| 5,164,659 A | * 11/1992 | Schultz et al. | 323/351 |
| 5,349,559 A | * 9/1994 | Park et al. | 365/201 |
| 5,694,076 A | * 12/1997 | Ishibashi | 327/541 |
| 5,856,753 A | 1/1999 | Xu et al. | 327/175 |
| 5,877,634 A | * 3/1999 | Hunley | 326/83 |
| 5,929,664 A | * 7/1999 | Alleven | 327/108 |
| 6,067,307 A | 5/2000 | Krishnamoorthy | 372/38 |
| 6,215,338 B1 | * 4/2001 | Gervasi et al. | 327/108 |
| 6,272,160 B1 | 8/2001 | Stronczer | 372/38.02 |
| 6,445,244 B1 | * 9/2002 | Stratakos et al. | 327/540 |

* cited by examiner

Primary Examiner—Timothy P. Callahan
Assistant Examiner—An T. Luu
(74) Attorney, Agent, or Firm—Kevin L. Daffer; Conley Rose P.C.

(57) ABSTRACT

A circuit, system, and method is provided for regulating the pulse width and/or duty cycle of a signal indirectly or directly used to drive, e.g., a transmitter. The load of the transmitter can be, for example, an optical signal transmitter. The circuit includes a feedback loop that adjusts the output signal so that the lower voltages are chopped at a reference voltage input into the driver. The magnitude of the reference voltage will regulate the pulse width of the output signal, as well as the duty cycle of the output signal. A low input voltage swing is well-suited to be operated upon by the driver circuit to produce a symmetric pulse width that is particularly adapted to high-speed optical data communication applications. The gain and slew rate of the feedback circuit and, predominantly, the comparator and pull-down transistor of the feedback circuit is tuned to ensure the pull-down transistor is always on and, therefore, the comparator will toggle, but within constrained (i.e., regulated) voltage limits.

12 Claims, 3 Drawing Sheets

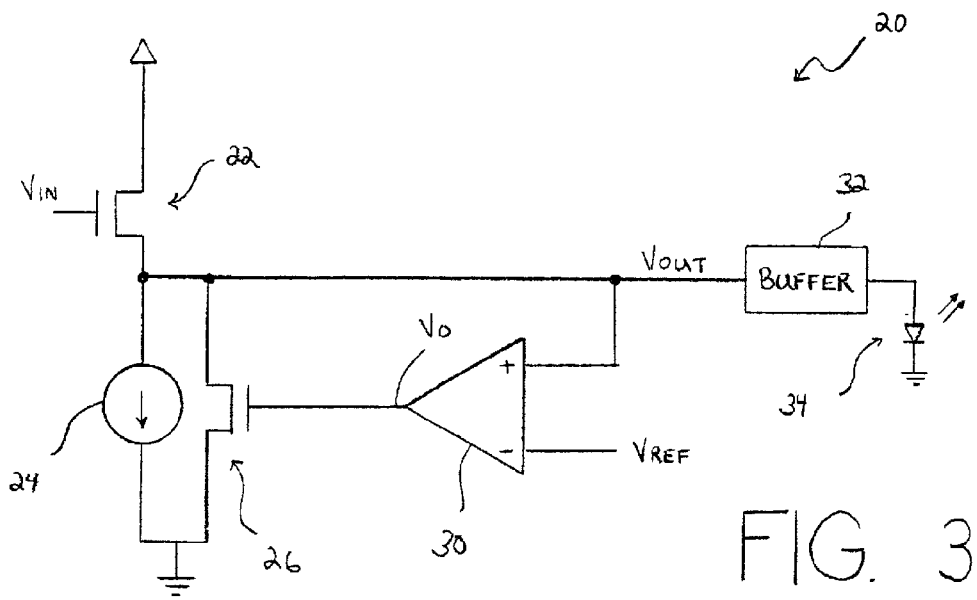
FIG. 3
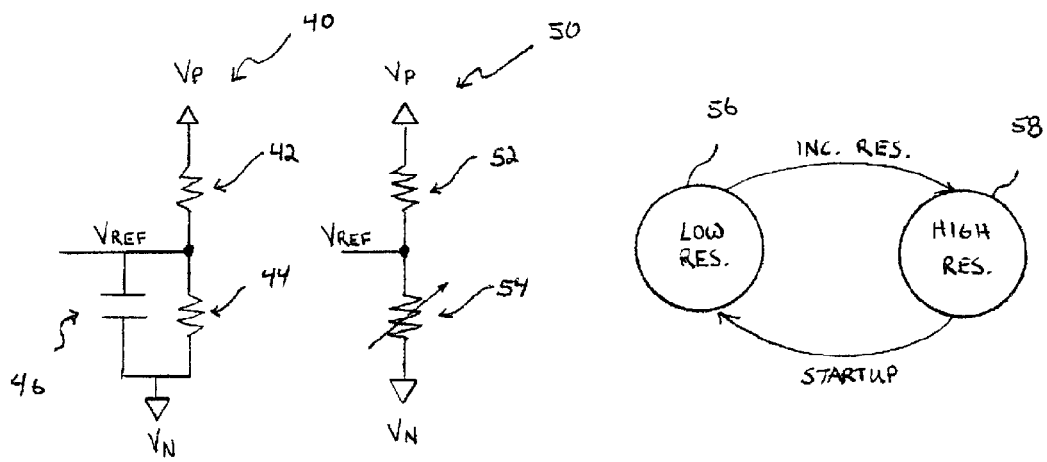
FIG. 4
FIG. 5

CIRCUIT AND METHOD FOR ADJUSTING DUTY CYCLE OF A HIGH SPEED, LOW SWING OUTPUT SIGNAL

BACKGROUND OF THE INVENTION

1. Field of the Invention

This invention relates to a circuit useful, for example, as a pulse width adjustment circuit applicable to an optical communication system. The circuit can produce an output signal that has an adjustable pulse width or duty cycle to compensate for disturbances on the output signal caused by the communication system.

2. Description of the Related Art

The following descriptions and examples are not admitted to be prior art by virtue of their inclusion within this section.

A driver circuit or buffer is generally recognized as a circuit which can drive a transmitter. The transmitter will then forward the appropriate signal across the transmission path to a receiver. Depending on the transmitter and the transmission path, the driver can be subjected to various load constraints that can impart distortion or skewing of the output signal produced by the driver.

A popular form of driver is one that is used to drive a light source. The light source can be a photodiode or laser. A popular photodiode is a light-emitting diode ("LED"), and a popular laser is a vertical-cavity surface-emitting laser ("VCSEL"). VCSELs have distinct advantages over LEDs in that lasers can transfer data across the transmission path at much higher rates and for further distances than LEDs. With the advent of SONET and high-speed Ethernet systems, fiber-optic transmission paths have become increasingly pervasive as a communication system. Moreover, use of VCSEL diodes as the light source to transmit optical data is also becoming increasingly popular.

Depending on the technology used, the light-emitting diode can operate at differing voltages and at differing speeds. A high-speed application, however, is less tolerant to skews in the driver output signal sent to the diode. Moreover, lower operating voltages of the diode may require additional output drive on the edges of each pulse to ensure a pulse width ratio is maintained across differing operating voltages.

U.S. Pat. No. 5,856,753 ("Patent '753), herein incorporated by reference, describes a driver circuit which can maintain a given pulse width and duty cycle across different operating voltages. Thus, if the operating voltage should decrease, instead of the duty cycle also decreasing at a given measuring point, the pulse width or duty cycle can be adjusted to maintain the pre-existing duty cycle. That duty cycle can be, for example, 50%. In optical communication systems, it becomes necessary in most instances to maintain a given duty cycle near 50% even though the light-emitting diode can operate at differing voltages and can induce load distortion or skew onto the output signal produced from the driver and sent to the diode.

As described in Patent '753, there are numerous ways in which to maintain a pulse width or duty cycle of the output signal sent from a driver into a load. The various methodologies described have certain disadvantages. It would be desirable to derive a driver circuit which can adjust the pulse width or duty cycle of an output signal produced by the driver circuit depending on the load or diode being used yet, however, the desired driver circuit produces an output signal that is symmetric on both the rising and falling edges of each pulse and does not require that the output signal be pulled up and down to the power supply rails. Accordingly, the desired driver circuit can adjust the pulse width or duty cycle of the output signal to compensate for disturbances in the load, and that the output signal purposely avoids voltage swings between the power supply rail and ground which would lessen the speed at which the output signal can transition. Thus, the desired output signal is one that has a low voltage swing and operates at high speed, readily used by VCSEL optical communication systems.

SUMMARY OF THE INVENTION

The problems outlined above are in large part solved by a high-speed, low-swing pulse width adjustment circuit and method. The circuit can adjust the pulse width or duty cycle of an output signal produced by the driver circuit. The driver circuit output signal does not transition between the power supply and ground voltages. Instead, the output signal transitions between a positive peak voltage and a negative peak voltage, where the reference voltage is preferably regulated at a voltage between the negative peak voltage and the positive peak voltage. Any change in the operating voltages of the load to which the output signal must be adjusted can be compensated for by correspondingly changing the reference voltage. Thus, if the output signal positive peak voltage decreases to accommodate a lower operating voltage of a load, the reference voltage can also decrease a proportionate amount so that the time at which each pulse extends upward from the reference voltage to the positive peak and back down to the reference voltage, will remain constant over dissimilar operating voltages (and dissimilar output signal peak voltages).

Adjusting the reference voltage in proportion to the output signal peak voltages, and any distortion or skewing affects of the load, ensures that the pulse width of the output signal can be regulated under any loading conditions. An input voltage to a source follower transistor will have a relatively small voltage swing. After chopping, this signal is further reduced. However, this signal can be amplified to achieve a desired swing for the driver. Additionally, regulating the reference voltage gives a desired pulse width and swing. This limited swing signal is particularly well-suited for driving a VCSEL diode for higher speed applications. If the reference voltage is properly regulated, a 50% duty cycle can be maintained for any distortion, skew, jitter, or operating voltage levels of a driver load device (e.g., a diode in an optical communication system). In certain optical communication systems, it is important to maintain a 50% duty cycle and, thus, the present driver can achieve that goal by simply regulating the reference voltage input to the driver circuit, where the output signal can maintain a symmetrical rise and fall transition without having to attempt adjusting the duty cycle by simply changing the fall transition and not the rising transition, as in certain prior art systems. A more robust pulse width and duty cycle regulator is, therefore, achieved by the improved driver circuit than conventional driver circuits.

According to one embodiment, a circuit is provided. The circuit comprises a comparator having an output and a pair of inputs. The pair of inputs are adapted to receive an output signal voltage produced from the circuit and a reference voltage forwarded to the circuit. The output of the comparator is coupled to a pull-down transistor that is connected to one of the pair of inputs of the comparator. The input of the comparator to which the pull-down transistor is connected is preferably the same input that receives the output signal.

According to another embodiment, a system is provided. The system is one that can adjust the pulse width or duty cycle of an output signal. The system includes a circuit for maintaining a reference voltage between the positive and negative voltage peaks of the output signal. A comparator is also provided and is coupled to compare a voltage of the output signal to the reference voltage. Depending, in part, on the slew rate and/or gain of the comparator, the comparator can fix the minimum voltage of the output signal to a voltage approximately equal to the reference voltage. The comparator is coupled in a feed-back arrangement so that the pulse width of the output signal varies in proportion to changes in the reference voltage. Along with the pulse width, a duty cycle of the output signal also varies in proportion to changes in the reference voltage. For example, an increase in the reference voltage will cause a corresponding decrease in the pulse width and duty cycle of the output signal. Conversely, a decrease in the reference voltage will cause a corresponding increase in the pulse width and duty cycle of the output signal. The slew rate and/or gain of the comparator is predetermined to preferably preclude a voltage of the output signal from being less than the reference voltage. The system can further include a pull-down transistor and an optical signal transmitter coupled to receive the output signal. Preferably, the transmitter is a VCSEL diode or LED.

According to yet another embodiment, a method is provided for regulating a duty cycle of an output signal. The method includes presenting the output signal into a comparator for comparing the output signal to a predetermined reference voltage and feeding back the results of the comparison to a pull-down transistor that chops the output signal between a periodic and symmetric positive peak voltage value and the reference voltage. The time at which the positive peak voltage value extends above the reference voltage and the ensuing duty cycle is directly proportional to the magnitude of the reference voltage.

BRIEF DESCRIPTION OF THE DRAWINGS

Other objects and advantages of the invention will become apparent upon reading the following detailed description and upon reference to the accompanying drawings in which:

FIG. 3 is a circuit and block diagram of a circuit that produces a high speed, low swing output signal having an adjustable duty cycle width forwarded, for example, to an optical transmitter of an optical communication system;

FIG. 4 represents alternative circuit diagrams of circuits used to produce the reference voltage of FIG. 3;

FIG. 5 is a state diagram of a controller used to adjust the variable resistance of, for example, the potentiometer of FIG. 4;

Figure 1:
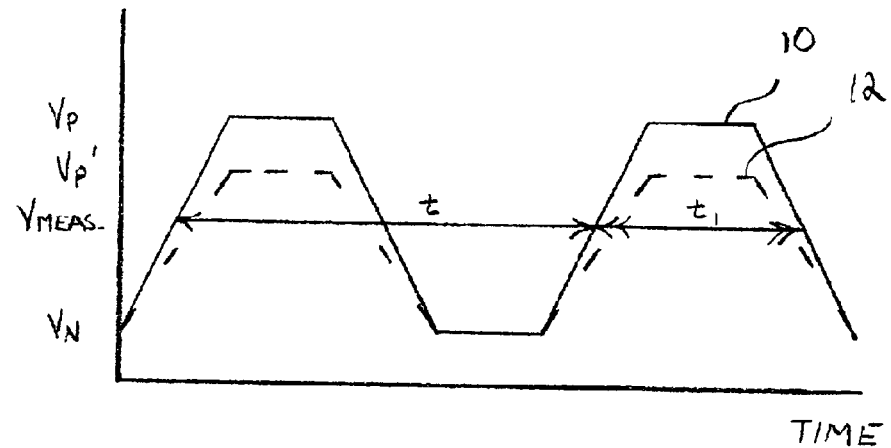
FIG. 1 is a timing diagram of different duty cycles and pulse widths of an output signal that is dependent on supply voltage differences and/or loading disturbance/slew rate effects on the output signal by a load circuit being driven by the output signal.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, FIG. 1 illustrates a timing diagram of an output signal 10 produced by a driver. Output signal 10 is shown to swing between a positive and negative peak voltage values ($V_P$ and $V_N$). The duty cycle of output signal 10 is the ratio $t_1/t$. Thus, the duty cycle is a measure of the proportion of time during which a circuit is operated. The circuit, being a load of the output signal of a driver is, therefore, operated during time $t_1$. The ratio of time at which a circuit is operated ($t_1$) is taken relative to the total length of time of the output signal (t).

It may be desirable to lessen the operating voltages of the driver circuit or, possibly, lessen the operating voltages of the load to which the driver circuit presents the output signal. In the example shown in FIG. 1, the output signal can be lessened to a positive peak voltage $V_P'$ that is less than $V_P$. For example, the operating voltage swing may change as indicated by numeral 12. Output signal 12, unfortunately, does not have the same duty cycle as output signal 10 if the measuring point of the duty cycle remains at $V_{MEAS}$. As the positive peak voltage decreases, FIG. 1 illustrates that duty cycle $t_1/t$ will also decrease. Therefore, the duty cycle of the output signal is dependent on the load into which the output signal is sent, and is also dependent on the operating voltages of the driver circuit. As described in subsequent drawings, the improved driver circuit overcomes these disadvantages by being able to regulate the duty cycle over any operating voltages or load conditions. For example, a 50% duty cycle (or 50%+/−5%) can be maintained over multiple operating voltages or load conditions, contrary to the problems shown in FIG. 1.

Figure 2:
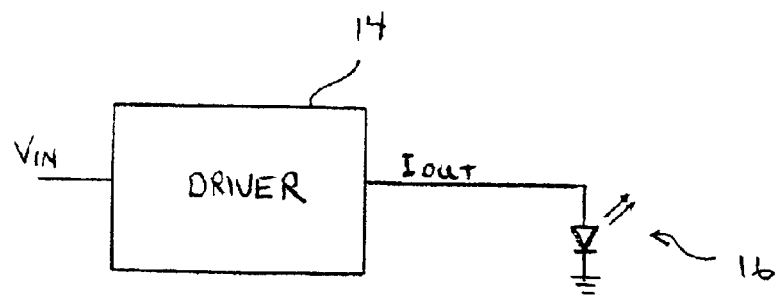
FIG. 2 is a block diagram of a driver circuit used to drive the output signal upon an optical communication system.

FIG. 2 illustrates the use of a driver circuit 14 used to drive an optical transmitter or diode 16. Diode 16 can be a VCSEL diode or an LED if it is intended that driver 14 be used to drive an optical communication system. Driver 14 is shown receiving a periodic input signal $V_{IN}$ and produces a periodic output signal $V_{OUT}$. In an optical transmitter system, a pulse width adjustment circuit can be coupled between a pair of pre-driver circuits. The pulse width adjustment circuit provides output to the second (within the pair) of pre-driver circuits. The pulse width adjustment circuit generates a signal of desired swing, desired DC level, and strength. If the output from the second pre-driver circuit is at a 50% duty cycle, the optical pulses produced by the photo-emitter (transmitter) may have more or less than 50% duty cycle due to the pulse width distortion on the photo-emitter (i.e., photo diode). Thus, the duty cycle and pulse width produced by the second pre-driver (post pulse width adjustment) must have some form of pulse width compensation in order to achieve, e.g., a 50% duty cycle in the optical pulses. An optical communication system should, therefore, include an input buffer, followed by a first pre-driver, followed by a pulse width (duty cycle) adjustment circuit, followed by a second pre-driver, and followed by a driver. The driver will, therefore, directly drive the photo diode.

FIG. 3 illustrates a driver circuit 20 that can produce a symmetrical pulse (equal slope on the positive and negative going edges of the pulse) with an adjustable pulse width. Driver circuit 20 is used for high-speed transitions where rail-to-rail transitions do not take place within the circuit, or upon the output signal. In case of VCSEL applications, the input signal $V_{IN}$ can be limited in swing to operate the driver circuit 20 at higher speeds, if desired. Thus, not only is the output signal $V_{OUT}$ restricted in voltage swing, but the input signal can be restricted as well so that the transitions occur at a high bit rate.

Circuit 20 includes a metal oxide silicon ("MOS") transistor 22 and a current source 24 coupled between a power supply voltage and ground. Alternatively, transistor 22 and current source 24 are connected between an upper supply voltage and a lower supply voltage (where the upper supply voltage is greater in magnitude than the lower supply voltage). Preferably, the input signal $V_{IN}$ to pulse width adjustment circuit 20 has a finite rise time and fall time and, thereby, has a small voltage swing in the order of a few hundred millivolts. The finite rise and fall times at $V_{IN}$ is the result of the preceding input buffer and pre-driver stages. If the rise and fall times should increase, then the greater is the amount of pulse width and duty cycle adjustment. Current source 24 can be made of any type of circuitry which produces a current in the direction of the arrow shown by source 24. Preferably, current source 24 has a rather large resistance value compared to the source-to-drain path of MOS transistor 26. Transistor 26 functions as a current source and will pull-down the output signal $V_{OUT}$ depending on the output of comparator 30.

If transistor 26 is off (the input to the gate conductor of transistor 26 does not exceed the threshold voltage above the lower voltage supply or ground), then the output of the source follower transistor 26 will follow the periodic cycle of the input voltage, but at possibly a higher DC voltage value. However, if transistor 26 is on (i.e., the voltage at the gate conductor of transistor 26 is greater than the threshold voltage above the lower voltage supply), then the pull-down function of transistor 26 will shift the DC level of the output signal to a lower DC value. The periodic cycle of the input signal will, however, remain regardless of whether transistor 26 is on or off.

Input to comparator 30 is a reference voltage $V_{REF}$ and the output signal $V_{OUT}$. The reference voltage is set somewhere between the positive peak value and the negative peak value of the output signal during times when transistor 26 is on. As the output signal falls from the positive peak voltage value to the negative peak voltage value (i.e., from the highest voltage value to the lowest voltage value), the output of comparator 30 $V_O$ remains at a relatively high voltage value. Being that $V_O$ is at a high voltage value as the output signal falls downward toward the lowest voltage value, transistor 26 remains on. Therefore, transistor 26 provides the extra current path in which current can be sent from the source-to-drain path of transistor 22 through both current source 24 and the source-to-drain current path of transistor 26.

As soon as the output signal $V_{OUT}$ reaches the reference voltage level $V_{REF}$, comparator 30 output $V_O$ will go to a relatively low logic level. The combination of comparator 30 and transistor 26 will maintain the output $V_O$ level in such a way that the output signal lower level remains at $V_{REF}$ and, therefore, comparator 30 output will settle at a relatively high voltage value for $V_O$. This will ensure that transistor 26 will always remain in an on (linear or saturated) state.

The output signal $V_{OUT}$ remains at $V_{REF}$ level until the new rising edge of $V_{IN}$ is received by circuit 20, thereby, causing the output signal to become strong enough to rise again to the positive peak voltage value. In this way, the output signal waveform gets essentially chopped (or "clipped") at the lowest level fixed at the chosen $V_{REF}$ value.

The slew rate or gain within comparator 30 should be predefined according to the speed and swing values. The slew rate is designed so that comparator 30 output maintains transistor in an active or "on" state by ensuring $V_O$ is above the threshold voltage or trigger point of transistor 26 at all times. Thus, the slew rate of comparator 30 is defined so that $V_O$ does not decline sufficiently that it would be less than the threshold voltage of transistor 26. Comparator 30 can be designed for high speed, gain, and slew rate (and this will be an inherent property of the comparator once designed).

By clipping or chopping the output signal so that the space between neighboring pulses is at a $V_{REF}$ level, circuit 20 can adjust the pulse width of the neighboring pulses since, in fact, each pulse is not a perfect square wave and, instead, has a slight angle or slope to the positive and negative going edges. Buffer 32 may or may not be used, depending on the logic high and logic low voltage values needed to drive, for example, an optical signal transmitter 34, such as a VCSEL diode or LED.

As defined herein, the slew rate is the speed at which the output voltage $V_O$ from comparator 30 changes with respect to the input voltage change of $V_{OUT}$ relative to $V_{REF}$. That speed is limited. The maximum limit, under linear operating conditions, is called the slew rate. Slew rate is a measurement of volts per second, or volts per millisecond, or other units of voltage per unit time. Thus, the slew rate limits the amplitude of an undistorted output swing of $V_O$ above some critical frequency. By adjusting the slew rate to that critical frequency, it can be determined that $V_O$ will ramp up from a threshold of transistor 26 to a higher voltage value and back down to a voltage above that threshold voltage. There are many types of comparators which function as high-speed op-amps which might slew at several thousand volts per microsecond (e.g., the LH0063C can slew at 6000 V/$\mu$s). Thus, comparator 30 can be made fast enough to operate at the high switching speeds needed for VCSEL applications.

FIG. 4 illustrates two different types of circuits which can be used to set the reference voltage. For example, circuit 40 employs a resistor-divider network of properly sized resistors 42 and 44 coupled between nodes which bear the positive supply voltage value fixed at the positive peak steady state voltage, and the negative peak supply voltage value fixed at the negative peak voltage (i.e., $V_P$ and $V_N$). Resistors 42 and 44 can be of equal size so that $V_{REF}$ is ideally at a midline voltage between the positive peak voltage value and the negative peak voltage value. A capacitor 46 may be used to retain that reference voltage should the positive or negative peak voltage values vary somewhat from their steady state peaks. If resistors 42 and 44 are equal, then the reference voltage will be exactly between positive and negative peak voltage swings. By chopping the input voltage to the reference voltage, the duty cycle of the input voltage is reduced.

Circuit 50 also illustrates a resistive divider network of two resistors 52 and 54. Resistor 54 can, however, be a variable resistor. One form of such a variable resistor is a potentiometer. A potentiometer is any type of variable resistor whose resistance value can be changed by any movable mechanism, for example. The movable mechanism (i.e., a mechanical or electrical mechanism) can be controlled by a state machine, for example.

FIG. 5 illustrates a state machine which can control the variable resistor, where the resistance of resistor 54 can vary from a low resistance value 56 to a high resistance value 58, and vice-versa. During start-up, the resistance value can be sent to a low resistance value 56. Thereafter, the resistance can be increased to a high resistance value. The amount of increase can be iterative. Thus, the increase can be a gradual step function with relatively high or low step resolution, if desired. Thus, when the circuit is first activated, $V_{REF}$ might be quite low compared to the positive peak voltage value $V_P$. When activated, the reference voltage may be anywhere but, preferably, is quite low and below the negative voltage level of the output signal. Thus, the comparator output $V_O$ is high and transistor 26 will pull down the DC point of the $V_{OUT}$ of the signal, in addition to level shifting provided by the source follower circuit. In this case, $V_{OUT}$ is a replica of $V_{IN}$, but with reduced DC level. Once the $V_{REF}$ is increased above the $V_N$ level of this $V_{OUT}$ signal, the chopping action starts, resulting in the $V_{OUT}$ signal with reduced pulse width and reduced swing. The $V_{OUT}$ signal can be further fed into the driver to get the required swing and DC levels to drive the optical system. This will cause the output voltage to swing downward to $V_{REF}$, which can be between $V_P$ and $V_N$ depending upon the required pulse width. As $V_{REF}$ increases, then the amount by which the pulse extends downward is further chopped until eventually the lowest level is fixed at the final $V_{REF}$ level (possibly between $V_P$ and $V_N$).

Figure 6:
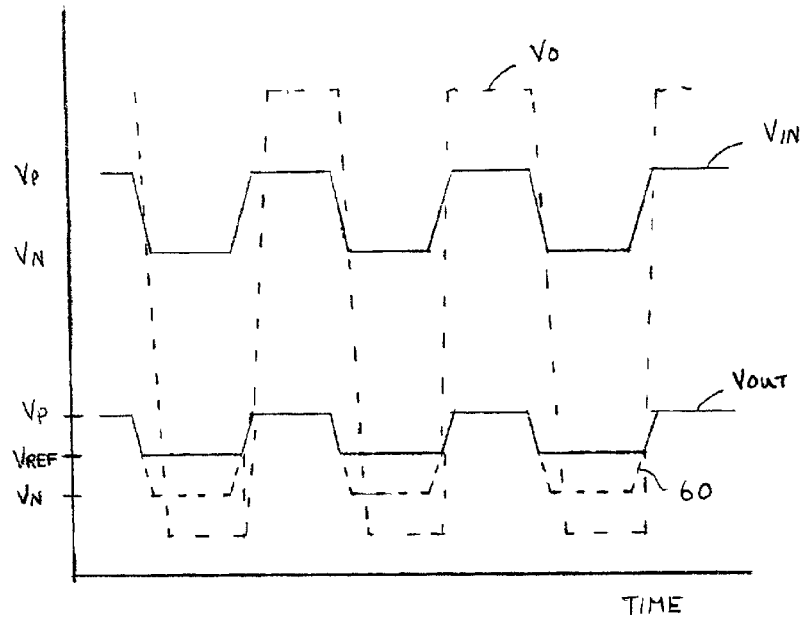
FIG. 6 is a timing diagram of an exemplary input signal forwarded into the circuit of FIG. 3 and the resulting output signal produced from the circuit of FIG. 3.

FIG. 6 illustrates a timing diagram of the input signal $V_{IN}$ forwarded to the circuit 20 of FIG. 3, and the ensuing output signal $V_{OUT}$. As shown, the output signal is chopped at $V_{REF}$ voltage value. Thus, the original output voltage which swings between the positive and negative peaks is chopped such that the negative peaks no longer exists on the output signal, and are shown by dashed line 60. The output signal follows the periodic wave form of the input signal $V_{IN}$ shown in dashed line. The magnitude of the input and output voltages are not drawn to scale, and are not indicative of the actual targeted voltage magnitudes. Preferably, the input signal has a peak-to-peak voltage value of some hundreds of millivolts, while the output voltage value between the positive voltage peaks and $V_{REF}$ may only be several hundred millivolts.

Preferably, the output voltage $V_O$ from comparator 30, shown in FIG. 3, is shown by the dashed line marked "$V_O$." Due to the slew rate and gain factors of the comparator and the pull-down transistors within the feedback loop, $V_O$ does not extend below the threshold voltage or trigger voltage ($V_{TH}/V_{TRIG}$) of the pull-down transistor. In this fashion, the pull-down transistor will always be on. The chopped $V_{OUT}$ signal is shown in solid line.

Figure 7:
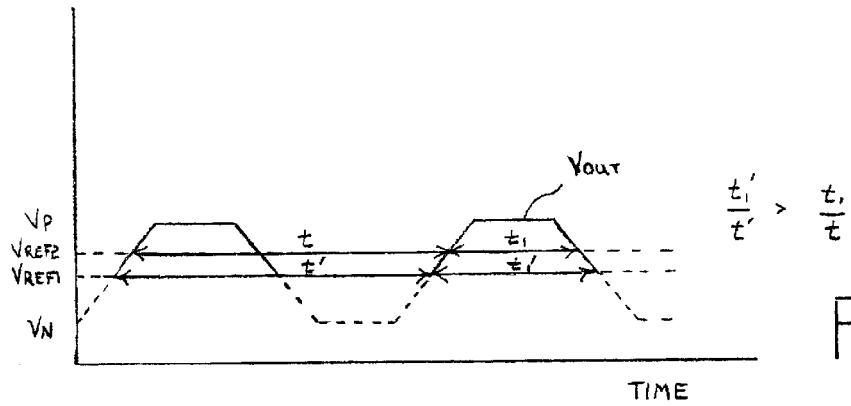
FIG. 7 is a timing diagram of another exemplary output signal produced from the circuit of FIG. 3, descriptive of differing pulse widths and duty cycles depending on the magnitude of the reference voltage.

FIG. 7 illustrates the differing pulse width of duty cycles which can be achieved by changing the reference voltage. For example, setting the reference voltage at $V_{REF1}$, will produce a greater pulse width $t_1'$ than if the reference voltage were set at $V_{REF2}$. Increasing the reference voltage from $V_{REF1}$ to $V_{REF2}$ will cause a decrease in the pulse width from $t_1'$ to $t_1$ and, more importantly, a decrease in the duty cycle of the ensuing output signal $V_{OUT}$. Thus, by regulating the reference voltage relative to the positive and negative peak voltage values of the output signal, the driver circuit can regulate the pulse width and the duty cycle of the output signal, all within the confines of a low swing input signal and output signal.

Figure 8:
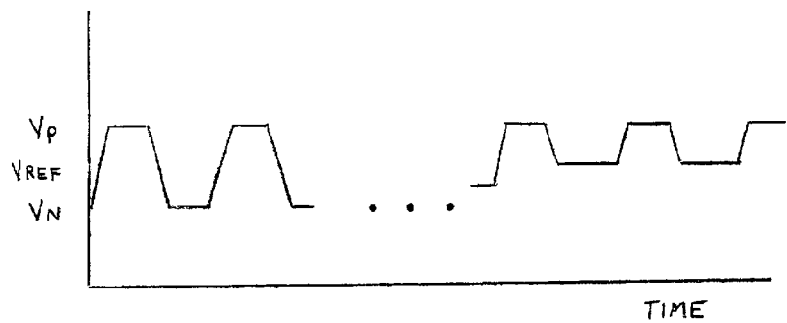
FIG. 8 is a timing diagram of the output signal changing to a final, periodic output signal in accordance with iterative changes to the reference voltage.

FIG. 8 illustrates the iterative increase of the reference voltage from, for example, the negative peak voltage value $V_N$ to the positive peak voltage $V_P$. Using the example shown in FIG. 5 and the variable resistor 54 of FIG. 4, the state machine of FIG. 5 can increase the resistance gradually of the variable resistor 54 from essentially a zero resistance value to a resistance value which is approximately the same as resistor 52 of FIG. 4. In this fashion, $V_{REF}$ can increase iteratively from $V_N$ to, for example, the mid-line voltage between $V_N$ and $V_P$, wherein $V_N$ and $V_P$ are the peak highest and lowest voltage values of the output signal while the pull-down transistor is on. One advantage is the adjustment to the resistor divider gives more freedom to adjust $V_{REF}$ from, e.g., outside the integrated circuit chip.

It would be appreciated to those skilled in the art having the benefit of this disclosure that the embodiments described are believed applicable to any driver circuit which can drive a periodic waveform with a form factor less than one onto an electronic subsystem, which is preferably a transmitter. The gain of the loop formed by comparator 30 and pull-down transistor 26 can be adjusted in such a way that the output signal lower level is always maintained at the reference voltage level. Designing driver circuit 20, thereby, entails sizing the pull-down transistor 26, the gain of comparator 30, and the slew rate of comparator 30, to achieve the required chopping of the output signal waveform. The amount of pulse width adjustment will, thereby, depend on the reference voltage level chosen.

The reference voltage level can be set in either of two possible ways. First, the reference voltage can be fixed inside the circuit by using an on-chip regulated supply voltage, and a resistive divider to obtain the required reference voltage value. This reference voltage is set between positive and negative peaks of the original output signal that is obtained when the pull-down transistor 26 is on and no feedback loop is active. Second, the reference voltage can be programmed with a constant supply and voltage divider with one variable resistor, such as a potentiometer. The voltage divider network and variable resistor can then determine the reference voltage value. Depending on the output signal pulse width, the resistance value can be fixed. In the start-up, the reference voltage can be kept near to the negative peak or, alternatively, at the ground level so that the output wave form is not chopped whatsoever. In this instance, the output from comparator $V_0$ is always at a logic high voltage value. However, as soon as the reference voltage extends upward from the $V_N$ level, the chopping action begins and proper calibration can be performed to adjust the reference voltage level and, accordingly, the duty cycle to any desired target (e.g., 50%).

The driver circuit works either with clock signals or with random bit patterns. In one application, the input signal $V_{IN}$ to the driver circuit can come directly from an input buffer. The output of the buffer will have a finite amount of rise and fall time, which may be typically at 10% of pulse width. Since the pull-down transistor 26 is acting equally on both the positive and negative edges of the feedback signal $V_0$, the rise and fall times will be affected equally after the chopping adjustment is made. Therefore, the ensuing output signal is symmetrical in terms of its pulse rise and fall slopes.

The specification and drawings are to be regarded in an illustrative rather than a restrictive sense as to possibly numerous modifications and alternative driver circuits, reference voltage select circuits, feedback arrangements, and gain/slew rate adjustment circuits which fall within the spirit and scope of the present invention.

What is claimed is:

1. A circuit, comprising a comparator having an output and a pair of inputs, wherein the pair of inputs are adapted to receive an output signal produced from the circuit and a reference voltage forwarded to the circuit, and wherein the circuit further comprises:

a pull-down transistor connected to one of the pair of inputs and the output; and a pull-up transistor having a gate conductor and a source-to-drain current path coupled between a power supply and one of the pair of inputs whenever a voltage of an input signal coupled to the gate conductor exceeds a voltage of the output signal by a threshold voltage of the pull-up transistor.

2. The circuit as recited in claim 1, wherein said one of the pair of inputs is coupled to receive the output signal.

3. The circuit as recited in claim 1, wherein the positive input of the pair of inputs is adapted to receive the output signal and the negative input of the pair of inputs is adapted to receive the reference voltage.

4. The circuit as recited in claim 1, wherein the pull-down transistor comprises a gate conductor and a source-to-drain current path between said one of the pair of inputs and a ground supply voltage whenever a voltage of the output coupled to the gate conductor exceeds the reference voltage.

5. The circuit as recited in claim 1, further comprising a current source coupled in parallel with the pull-down transistor between said one of the pair of inputs and a ground supply voltage.

6. A system for adjusting a pulse width of an output signal, comprising:

a circuit for maintaining a reference voltage between positive and negative voltage peaks a comparator coupled to compare a voltage of the output signal to the reference voltage;

a pull-down transistor coupled to an output of the comparator for fixing a minimum voltage of the output signal to a voltage approximately equal to the reference voltage whereby the pulse width of the output signal varies in proportion to changes in the reference voltage;

wherein the comparator comprises a slew rate and/or gain which is predetermined to preclude a voltage of the output signal from being less than the reference voltages; and wherein the output signal comprises a duty cycle that varies in proportion to changes in the reference voltage.

7. The system as recited in claim 6, wherein the pull-down transistor comprises a gate conductor and a source-to-drain current path, wherein the gate conductor is coupled to receive an output from the comparator and the source-to-drain current path is maintained during times when the reference voltage is maintained at approximately a midline voltage between the positive and negative voltage peaks of the output signal.

8. The system as recited in claim 7, wherein the comparator comprises a predefined slew rate and/or gain so that an output voltage from the comparator will not go below a threshold voltage of the pull-down transistor.

9. The system as recited in claim 6, wherein the circuit is adapted to increase the reference voltage and thereby cause a corresponding decrease in the pulse width and a duty cycle of the output signal.

10. The system as recited in claim 6, wherein the circuit is adapted to decrease the reference voltage and thereby cause a corresponding increase in the pulse width and a duty cycle of the output signal.

11. The system as recited in claim 6, wherein portions of the output signal below the reference voltage are chopped and remove at the reference voltage.

12. The system as recited in claim 6, further comprising an optical signal transmitter coupled to receive the output signal.

* * * * *

UNITED STATES PATENT AND TRADEMARK OFFICE
CERTIFICATE OF CORRECTION

PATENT NO.   : 6,762,636 B1
DATED        : July 13, 2004
INVENTOR(S)  : Khawshe

It is certified that error appears in the above-identified patent and that said Letters Patent is hereby corrected as shown below:

Column 9,
Line 27, please insert -- ; -- after "voltage peaks."

Column 10,
Lines 3-4, please delete "reference voltages" and substitute therefor
-- reference voltage --.

Signed and Sealed this

Seventh Day of December, 2004

JON W. DUDAS
*Director of the United States Patent and Trademark Office*